US009564885B2

(12) United States Patent
Chau et al.

(10) Patent No.: US 9,564,885 B2
(45) Date of Patent: Feb. 7, 2017

(54) EVENT-DRIVEN CLOCK DUTY CYCLE CONTROL

(71) Applicant: Rambus Inc., Sunnyvale, CA (US)

(72) Inventors: Pak Shing Chau, Saratoga, CA (US); Wayne S. Richardson, Saratoga, CA (US); Jun Kim, Los Altos Hills, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/361,575

(22) PCT Filed: Nov. 16, 2012

(86) PCT No.: PCT/US2012/065445
§ 371 (c)(1),
(2) Date: May 29, 2014

(87) PCT Pub. No.: WO2013/085695
PCT Pub. Date: Jun. 13, 2013

(65) Prior Publication Data
US 2014/0333361 A1    Nov. 13, 2014

Related U.S. Application Data

(60) Provisional application No. 61/567,062, filed on Dec. 5, 2011.

(51) Int. Cl.
H03K 3/017    (2006.01)
H03K 5/156    (2006.01)
H03K 3/012    (2006.01)

(52) U.S. Cl.
CPC ............ H03K 5/1565 (2013.01); H03K 3/012 (2013.01); H03K 3/017 (2013.01)

(58) Field of Classification Search
USPC ........................................................ 327/175
See application file for complete search history.

(56) References Cited

U.S. PATENT DOCUMENTS 6,545,621 B1    4/2003    Madni et al.
7,298,193 B2    11/2007   Agarwal et al.
(Continued)

OTHER PUBLICATIONS

Agarwal et al., "A Duty-Cycle Correction Circuit for High-Frequency Clocks", IBM, Austin, TX 78758, 2006 Symposium on VLSI Circuits Digest of Technical Papers. 2 pages.
(Continued)

*Primary Examiner* — Lincoln Donovan
*Assistant Examiner* — Patrick Chen
(74) *Attorney, Agent, or Firm* — Charles Shemwell

(57) ABSTRACT

Duty cycle error vectors that indicate both the magnitude and direction of the duty cycle error relative to a desired duty cycle are generated within a duty cycle measurement circuit, enabling threshold-based determination of whether duty cycle adjustment is necessary, refraining from power-consuming adjustment and follow-up measurement in those cases where the duty cycle is within a target range. When duty cycle adjustment is deemed necessary, the magnitude of the duty cycle error indicated by the duty cycle error vector may be applied to effect proportional rather than incremental duty cycle adjustment, quickly returning the clock duty cycle to a target range.

20 Claims, 5 Drawing Sheets

(56) References Cited

U.S. PATENT DOCUMENTS

| | | |
|---|---|---|
| 7,928,783 B2 | 4/2011 | Yun et al. |
| 2003/0072379 A1 | 4/2003 | Ketchum |
| 2008/0191764 A1* | 8/2008 | Lim ........................ H03K 5/133 |
| | | 327/161 |
| 2008/0315930 A1* | 12/2008 | Gomm ................. H03K 5/1565 |
| | | 327/175 |
| 2009/0134955 A1* | 5/2009 | Sheng ..................... H03J 1/005 |
| | | 333/174 |
| 2009/0243677 A1 | 10/2009 | Becker et al. |
| 2011/0043251 A1* | 2/2011 | Kusuda ............... H03M 1/0818 |
| | | 326/93 |
| 2011/0074477 A1 | 3/2011 | Nagarajan et al. |
| 2011/0291584 A1 | 12/2011 | Filippo et al. |
| 2012/0223754 A1 | 9/2012 | Lewis |

OTHER PUBLICATIONS

International Search Report and Written Opinion dated Feb. 5, 2013 in International Application No. PCT/US2012/065445. 16 pages.
PCT International Preliminary Report on Patentability dated Jun. 19, 2014 (Chapter I) in International Application No. PCT/US2012/065445. 10 pages.

\* cited by examiner

EVENT-DRIVEN CLOCK DUTY CYCLE CONTROL

CROSS REFERENCE TO RELATED APPLICATIONS

Pursuant to 35 U.S.C. §§365 and 371, this application is a United States National Stage Application that claims priority to International Application No. PCT/US2012/065445 filed Nov. 16, 2012, which claims priority to U.S. Provisional Patent Application No. 61/567,062 filed Dec. 5, 2011. Each of the above-identified patent applications is hereby incorporated by reference in its entirety.

TECHNICAL FIELD

The present invention relates generally to the field of integrated circuits, and more particularly to clock duty cycle control in integrated circuit devices and systems of integrated circuit devices.

BACKGROUND

Clock duty cycle error is typically corrected in a continuous servo loop. In a conventional implementation, an error detector generates a continuous stream of error direction signals indicating which of the high and low clock phases is longer, and an adjustment circuit incrementally adjusts the clock duty cycle in response to each error direction signal.

While the continuous servo approach works acceptably in some applications, shrinking voltage supply headroom, decreasing output impedance, and increasing sub-threshold leakage are becoming problematic for traditional analog error detector implementations. Beyond the implementation challenges, continuous error detection and correction exacts a cost from increasingly limited power budgets, and the slow, incremental duty cycle adjustment is becoming a performance bottleneck in the face of increasingly complex clocking schemes employed in modern electronics devices (e.g., on-demand frequency transitions, and clock start/stop).

BRIEF DESCRIPTION OF THE DRAWINGS

The present invention is illustrated by way of example, and not by way of limitation, in the figures of the accompanying drawings, in which like reference numerals refer to similar elements and in which.

DETAILED DESCRIPTION

Efficient, responsive clock duty cycle control is achieved in embodiments herein through various combinations of event-driven duty cycle measurement, error vector generation, conditional duty cycle adjustment, and proportional duty cycle adjustment. In a number of embodiments, for example, duty cycle measurement is carried out discontinuously in response to various triggering events or combinations of triggering events indicating that duty cycle adjustment may be necessary. Under this event-driven approach, duty cycle measurement and related adjustment circuitry may be powered off for substantial intervals, avoiding the continuous power drain suffered by conventional schemes. In event-driven embodiments and others, duty cycle error vectors that indicate both the magnitude and direction of the duty cycle error relative to a desired duty cycle are generated within a duty cycle measurement circuit, thus enabling intelligent determination of whether duty cycle adjustment is necessary, refraining from power-consuming duty cycle adjustment and subsequent confirming measurement in those cases where the duty cycle is within a target range. Further, when duty cycle adjustment is deemed necessary, the magnitude of the duty cycle error indicated by the duty cycle error vector may be applied to effect proportional rather than incremental duty cycle adjustment, quickly returning the clock duty cycle to a target "lock" range in a single correction (or small number of corrections) instead of an extended sequence of incremental adjustments. Rapid duty cycle locking is particularly advantageous in systems that require clock frequency agility (i.e., on-the-fly transition between different clock frequencies), burst mode operation (i.e., starting and stopping the clock to effect a reduced aggregate operating rate) or routine sleep mode entry/exit, avoiding the latency penalty otherwise incurred waiting for a minimum (e.g., worst-case) number of incremental duty cycle corrections before beginning clocked operations.

Figure 1:
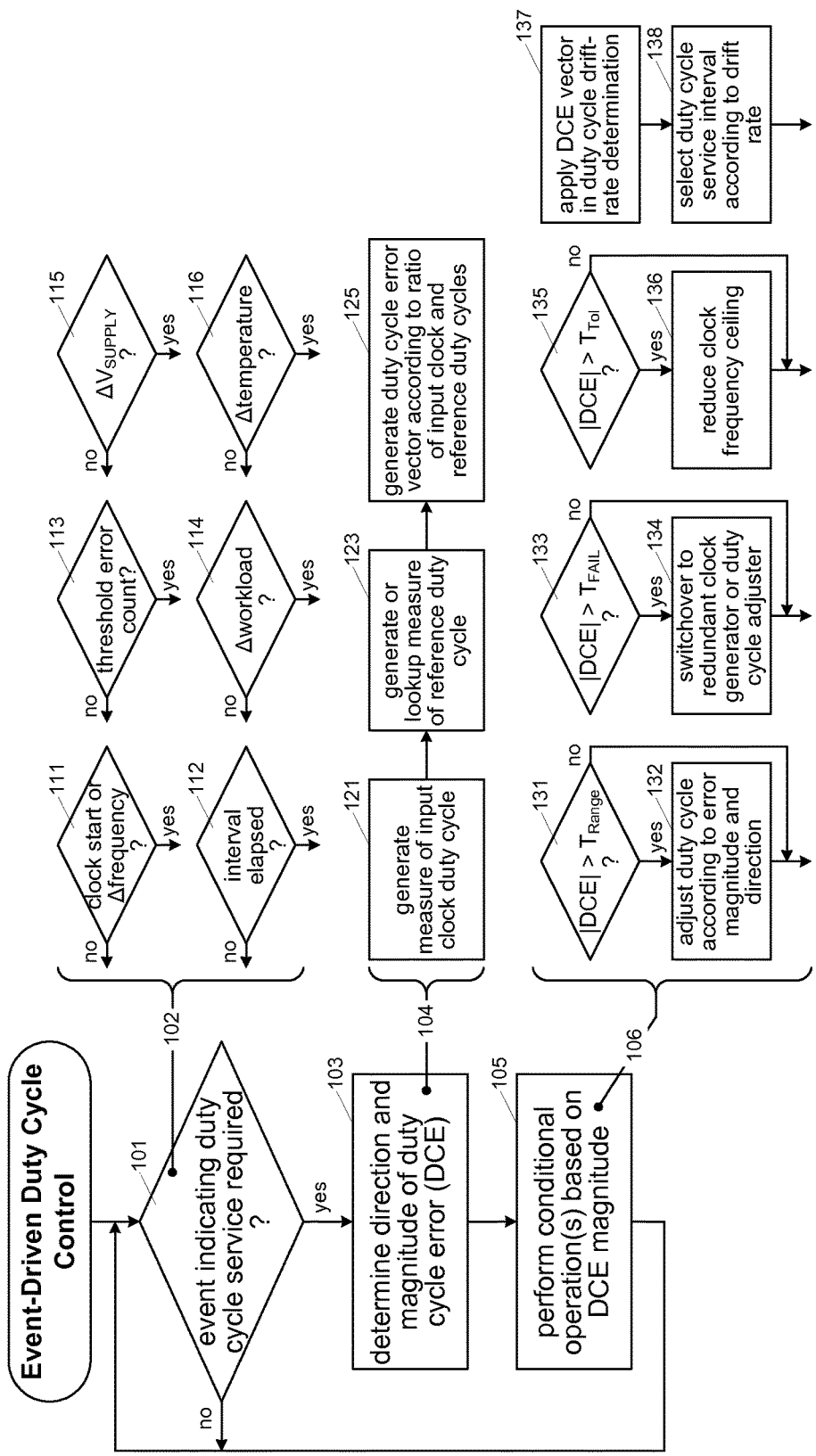
FIG. 1 illustrates exemplary high-level duty cycle control operations that may be performed within an event-driven duty cycle controller.

FIG. 1 illustrates exemplary high-level duty cycle control operations performed within an event-driven duty cycle controller according to embodiments herein. In general, the duty cycle controller may be implemented by circuitry within any clocked integrated circuit (IC) device or interconnected set of IC devices, with the clocked IC device or devices (the "clocked system") forming part of a larger "host system" such as a computer, smartphone, or any other consumer, industrial or military product having clocked electronic circuitry. In a number of embodiments, for example, the clocked system is assumed to be a memory subsystem having interconnected control and memory components which collectively implement an event-driven duty cycle controller. Other types of systems or subsystems with various types of IC devices may form the clocked system in alternative embodiments (e.g. control component and buffer component in a buffered memory system, processor and application-specific IC (ASIC) in a northbridge connection, etc.), and the clocked system may be effected within a single IC. In all such cases the IC or ICs that form the clocked system may be packaged individually and interconnected on the same or separate circuit boards (e.g., as in the case of a processor, memory controller or other control component being mounted to a mother board, and a memory component being mounted to a memory module that is removably inserted within a module connector of the mother board) or even directly interconnected (e.g., as in a package-on-package), or may be packaged together with one another and/or other IC devices within a multiple-IC package (e.g., as in a system-in-package, multi-chip module, three-dimensional IC, package-in-package, etc.).

Continuing with FIG. 1, the duty cycle controller initially loops or waits at 101 until occurrence of an event indicating that duty cycle service is required. While awaiting such an event, referred to herein as a "triggering event," the duty cycle controller may power off or otherwise disable duty cycle error detection circuitry, thereby avoiding the static power drain that plagues continuous error detection systems. As shown at 102, numerous different criteria may be evaluated alone or in any combination to determine whether a triggering event has occurred, including without limitation whether the clock signal of interest (the "input clock signal") has been started or re-started after being in a non-oscillating state (111), whether the clock signal has changed frequency (111), whether a predetermined or programmed time interval has elapsed (112), whether a threshold error count or error rate has been detected (113) within the host system (e.g., bit error rate in signals transmitted synchronously with respect to the clock signal of interest or other timing signal derived therefrom), whether changes in workload (114) of the clocked system or host system have occurred (indicating concomitant temperature and/or voltage changes), whether supply voltages and/or system or ambient temperatures have changed (115, 116, respectively) and so forth. Any or all such triggering events may be detected within the clocked system or signaled by other detection or control circuits within the host system (e.g., signals indicating supply voltage change from variable-output supply voltage generator, signal from clock control circuitry indicating a clock start event or clock frequency transition, etc.). Also, fixed or programmable thresholds may be employed within the clocked system or host system and applied to determine whether a given triggering event or combination of triggering events has occurred. As an example, voltage change thresholds, temperature change thresholds, error rate thresholds and so forth may be programmed within one or more registers or established within other configuration circuits of the clocked system or host system during system production or run-time to establish triggering event criteria.

Upon detecting a triggering event at 101, the duty cycle controller evaluates the duty cycle of the input clock signal at 103, generating a duty cycle error vector that indicates not only the direction of any inequality (error) between the durations of the high and low clock phases but also a magnitude of the inequality and thus a magnitude of the duty cycle error. In one embodiment, shown for example in detail view 104, the duty cycle controller generates a measure of the input clock duty cycle at 121 and also generates (or looks up or otherwise obtains) a measure of a reference duty cycle at 123. The duty cycle controller then generates a duty cycle error vector according to a ratio of the input clock and reference duty cycle measurements at 125.

Obtaining a measure of the magnitude of the duty cycle error opens the door to a number of conditional actions as indicated generally at 105 and by way of example in detail view 106. First, depending on whether the error magnitude (|DCE|) exceeds an error-range threshold (affirmative decision at 131), the duty cycle controller may conditionally adjust (i.e., adjust or refrain from adjusting) the clock duty cycle at 132. Additionally, error magnitudes determined to exceed a failure threshold (133) may trigger switchover to one or more redundant clock generation circuits (135) and/or notification of component failure to a host system user. Error magnitudes determined to exceed a tolerance threshold (135) may trigger reduction of a maximum (ceiling) oscillation frequency to be enabled within a frequency-agile clock generator (136) and/or notification to a user of the host system of impending component failure. Further, to the extent that a sequence of magnitude errors indicate slower or faster duty cycle drift than accounted for by the triggering event frequency, the duty cycle service rate (e.g., interval at 112) may be decreased or increased. As shown at 137, for instance, the duty cycle error vector may be applied in a duty cycle drift-rate determination (e.g., determining a difference between the error vector and a previously generated error vector and combining that difference value with difference values generated in response to prior error vectors in a filtering operation), with the drift rate being used to select the duty cycle service interval at 138, effectively selecting a new duty cycle service interval if the drift rate has shifted beyond a boundary threshold.

The various thresholds applied in the foregoing conditional operations (e.g., at 131, 133, 135) may be programmed (stored or loaded) within respective programmable registers or respective fields within one or more programmable registers at system startup or dynamically during host system operation. The thresholds may alternatively be effected within hardwired configuration logic or one-time programmable circuits (e.g., fused logic circuits configured, for example, at host system production time). Also, while separate thresholds are shown for various conditional operations, two or more conditional operations may share the same threshold and thus be performed if the threshold is exceeded. Conversely, instead of a single magnitude threshold being used to define symmetric upper and lower error bands or error ranges that are centered about the balanced duty point (50%), separate upper and lower magnitude thresholds (i.e., direction-dependent thresholds) may be used to establish an asymmetric or direction-dependent error ranges. For example, in an application where shorter clock pulses are more tolerable than longer clock pulses, a lower threshold may be programmed to allow clock pulses to shrink to a minimum duty cycle of, say, 40%, while an upper threshold is programmed to allow clock pulses to grow to a maximum duty cycle of, say, 55%, thus effecting a 15% deadband (i.e., error range within which the corresponding conditional operation is not executed) spanning but not centered on the balanced duty point.

Figure 2:
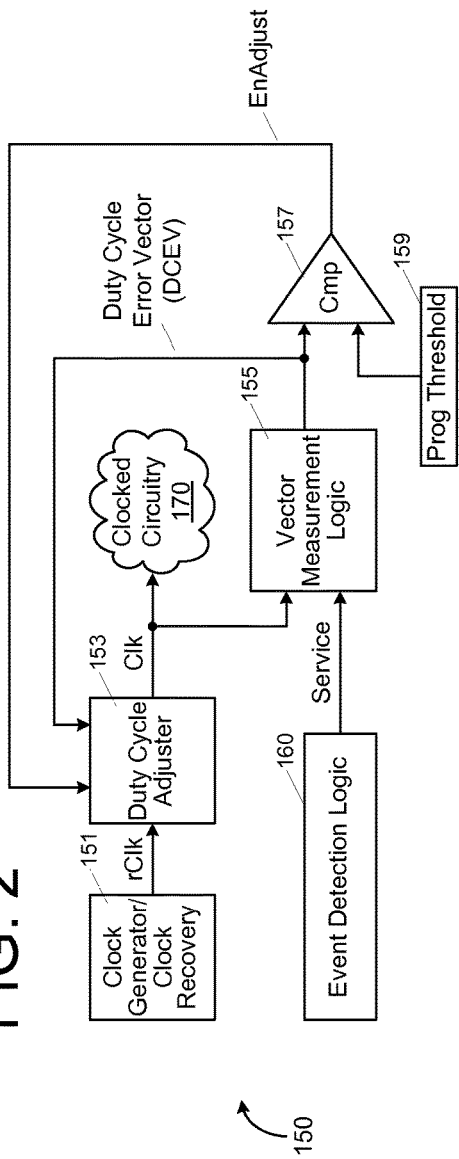
FIG. 2 illustrates an embodiment of an event-driven duty cycle controller capable of performing the control operations shown in FIG. 1.

FIG. 2 illustrates an embodiment of an event-driven duty cycle controller 150 capable of performing the control operations shown in FIG. 1. As shown, duty cycle controller 150 includes a clock generator 151, duty cycle adjuster 153, vector measurement logic 155, comparator 157, threshold register 159 and event detection logic 160. Clock generator 151 may be a free-running oscillator (e.g., a crystal oscillator, ring oscillator, tank oscillator, etc.), a phase-or-frequency controlled oscillator (a phase-locked loop (PLL), delay-locked loop (DLL), injection-locked oscillator (ILO), etc.), a clock recovery circuit such as a clock-data-recovery circuit or signal-level converter (e.g., converting a clock signal from one level to another), or any other source of an occasionally or continuously oscillating waveform that may exhibit duty cycle error. However implemented, clock generator 151 outputs clock signal "rClk" to duty cycle adjuster 153 which applies a duty cycle correction value to yield a duty-corrected clock signal, "Clk." The duty-corrected clock signal is supplied to various clocked circuit blocks ("clocked circuitry") within the larger clocked system (e.g., clock tree to fan out the clock to multiple synchronously clocked logic blocks, clocked input/output (I/O) circuits to permit synchronous communication with respect to one or more attached IC devices, clock transmitters to forward the clock signal to one or more attached IC devices, etc.) and also to vector measurement logic 155. The vector measurement logic, when enabled by a "service" signal from event detection logic 160 (i.e., logic circuitry to determine when duty cycle service is required as shown at 101 in FIG. 1 and, in response, to assert the service signal) generates a duty cycle error vector ("DCEV") indicating both the direction and magnitude of the duty cycle error. The magnitude of the duty cycle error is compared with a range-defining magnitude threshold (i.e., from threshold register 159 and which may include multiple thresholds as discussed above) within comparator 157 which, in turn, either asserts or deasserts an adjust-enable signal ("EnAdjust") according to whether the error magnitude exceeds or falls below the magnitude threshold, respectively.

Still referring to FIG. 2, the duty cycle error vector and the adjust-enable signal are fed back to duty cycle adjuster 153 which conditionally adjusts the clock duty cycle according to the magnitude and direction of the duty cycle error indicated by the error vector. In one embodiment, for example, duty cycle adjuster 153 arithmetically sums the duty cycle error magnitude with a pre-existing duty cycle correction value if the adjust-enable signal is asserted, adding or subtracting the error magnitude according to the direction of the duty cycle error to yield an updated duty cycle correction value and thereby adjust the clock duty cycle. If the adjust-enable signal remains deasserted following vector measurement (i.e., duty cycle error magnitude within threshold-defined range), duty cycle adjuster 153 refrains from updating the duty cycle correction value and thus continues applying the pre-existing duty cycle correction value at least until the next service signal assertion.

In the embodiment of FIG. 2, vector measurement logic performs no measurement operation until signaled by event detection logic 160 and thus may be disabled to save power until that time. To the extent that comparator 157 draws static power, it may similarly be disabled, as may circuitry within the duty cycle adjuster that serves to apply and latch (or register) an updated duty cycle error correction value. Thus, duty cycle controller 150 operates discontinuously, idling in a low power state until enabled in response to a triggering event. In alternative embodiments, the duty cycle controller may operate continuously, generating and conditionally applying error vector measurements one after another without delay.

Figure 3:
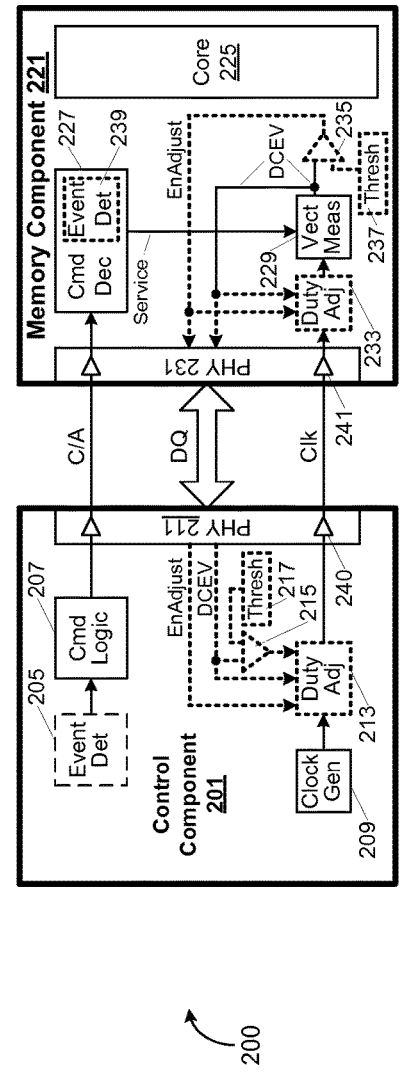
FIG. 3 illustrates an embodiment of a duty cycle controller in which constituent functional blocks are distributed within a system of IC devices.

FIG. 3 illustrates an embodiment of a duty cycle controller in which constituent functional blocks are distributed within a system of IC devices; in this example, a memory system 200 having a control component 201 and memory component 221 interconnected by command/address (CA), data (DQ) and clock (Clk) signaling links. Control component 201 may be implemented by a variety of integrated circuit devices such as a general-purpose or special-purpose processor, dedicated memory controller, application specific IC (ASIC) and so forth, and memory component 221 may likewise be implemented by a broad variety of memory devices including, for example and without limitation, a dynamic random access memory (DRAM), static RAM (SRAM), or flash memory or any other type of integrated circuit having a memory storage function.

The circuit blocks and signaling paths depicted within control component 201 and memory component 221 are limited primarily to those involved in clock generation and clock duty cycle correction, with at least some of the circuit blocks and signaling paths shown by dashed lines (or dashed outline) to emphasize their optional nature. In the embodiment shown, control component 201 includes a clock generator 209, physical signaling interface 211 (PHY) and command logic 207, as well as optional duty cycle adjuster 213, event detector 205, error comparator 215 and threshold register 217. Memory component 221 includes a counterpart PHY 231, command decoder 227, memory core 225 and vector measurement logic 229, as well as an optional duty cycle adjuster 233, error comparator 235, threshold register 237 and event detector 239 (the latter shown, for example, as being part of the command decoder 227, though it may alternatively be implemented separately from the command decoder).

Clock generator 209 produces a control-side clock signal that is conditionally adjusted within optional duty cycle adjuster 213 and then forwarded to memory component 221 via output driver 240 and receiver 241 within counterpart signaling interfaces 211 and 231. Though not shown, the control-side clock signal and/or timing signals derived therefrom may be supplied to various component blocks within control component 201 to time control and I/O operations. For example, a frequency-multiplied instance of the control-side clock may be supplied to signaling interface 211 to time command/address transmission, write data transmission, and/or read data reception, including timing transitions of strobe or other timing signals output to memory component 221 to time reception of write data therein.

Still referring to FIG. 3, the output driver and receiver circuits 240 and 241 may perform signal-level conversion, for example, converting the control-side clock signal from a logic level signal (e.g., complementary metal oxide semiconductor (CMOS) signaling level) to a small-swing signal for transport over the clock signaling path, and then performing a counterpart conversion to restore a logic-level clock signal within memory component 221. In instances of signal-level converters that impart appreciable duty cycle error, it may be preferable to perform duty cycle error adjustment within the memory component itself, and thus within optional duty cycle adjuster 233. In that case, the duty cycle adjustment loop is effectively closed within memory component 221 so that control-side duty cycle adjuster 213 may be omitted. In such an embodiment, a separate duty cycle correction loop may be implemented within the control component 201, for example by providing an instance of vector measurement logic 229 within control component 201, together with the optional duty cycle adjuster 213, comparator 215 and threshold logic 217 shown.

In either loop closure embodiment (i.e., duty cycle correction loop closed within memory component, or through a combination of the control and memory components), vector measurement logic 229 within the memory component responds to assertion of a service signal ("Service") by generating a duty cycle error vector ("DCEV") that indicates the magnitude and direction of the clock duty cycle error as described above. As shown, the duty cycle error vector is fed back either to local duty cycle adjuster 233 or to control-side duty cycle adjuster 213, with the error vector being conveyed in the latter case via one of the chip-to-chip signaling paths shown (e.g., via one or more data links, via the command/address path if implemented to enable bi-direction information transfer) or via a configuration link or other sideband signaling path (e.g., serial I/O or other communication channel used to effect relatively low-bandwidth information exchange).

Still referring to FIG. 3, the duty cycle error vector is compared with a range-defining threshold to generate an adjust-enable signal, an operation optionally performed by memory-side comparator 235 applying the threshold provided by programmable register 237, or by control-side comparator 215, applying the threshold provided by register 217. When generated within memory component 221, the adjust-enable signal may be fed back to either the memory-side or control-side duty cycle adjuster (233, 213) to enable conditional duty cycle adjustment operations therein (i.e., conditionally enabling the local duty cycle adjuster 233 or the remote duty cycle adjuster 213 to apply the error vector in a duty cycle adjustment operation), with the adjust-enable signal being conveyed in the latter case via one of the chip-to-chip signaling paths shown or over a sideband signaling path.

The service signal that triggers error vector measurement may be asserted in response to events detected within memory-side event detector 239, control-side event detector 205 or both. For example, logic to determine whether triggering events have occurred (e.g., elapsed time, threshold error rates, clock frequency change, workload change, temperature and/or voltage change, etc.) may be implemented within control-side event detector and coupled to command logic 207 to enable injection (i.e., insertion or scheduling) of duty cycle measurement requests within the outgoing command stream. By this arrangement, control component 221 can schedule duty cycle measurements (service events) during idle intervals or concurrently with other commanded maintenance operations (e.g., refresh operations within a DRAM device) to minimize resource conflict or other disruption. Hiding duty cycle control operations under refresh or other maintenance events may be particularly beneficial, for example, in embodiments that employ the command/address path, data path and/or other shared resource to convey error vector information from the memory component to the control component. In any case, upon receiving a duty cycle measurement request from control component 201, command decoder 227 may responsively assert the service signal or may wait for further events signaled by the control component (e.g., DRAM refresh request) or detected by local event detector 239 (e.g., self-refresh timer expiration). In other embodiments, memory-side event detector 239 may autonomously trigger error vector measurement operations either exclusively (in which case control-side event detector 205 may be omitted) or supplementally with respect to vector measurement requests signaled by control component 221. In either case, the service signal is asserted to trigger duty cycle error vector determination within vector measurement logic 229, an operation discussed in detail below.

Figure 4B:
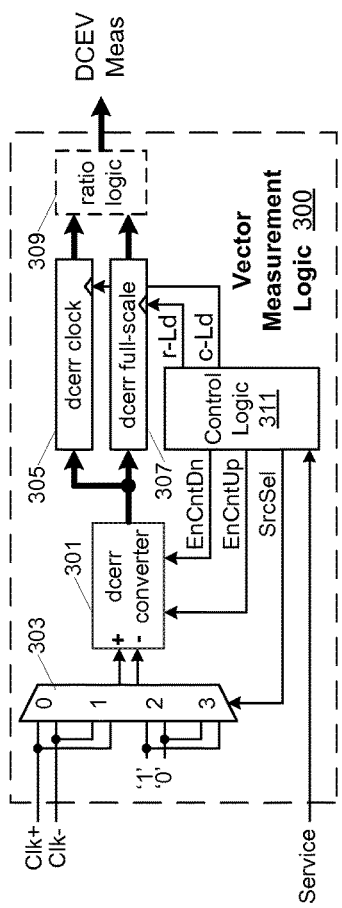
FIG. 4B illustrates an alternative embodiment of an error vector measurement logic circuit that may be used to implement the error vector measurement logic of FIGS. 2 and 3.
Figure 4A:
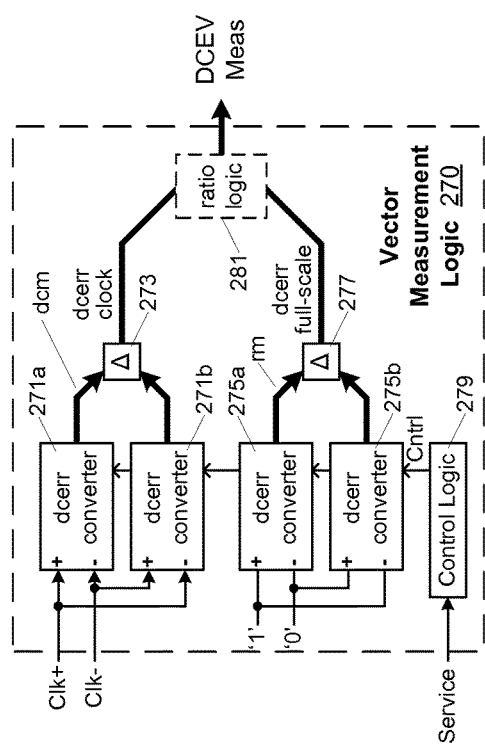
FIG. 4A illustrates an embodiment of a vector measurement logic circuit that may be used to implement the vector measurement logic shown in FIGS. 2 and 3.

FIG. 4A illustrates an embodiment of a vector measurement logic circuit 270 that may be used to implement the vector measurement logic shown in FIGS. 2 and 3. As shown, a differential input clock (Clk+, Clk−) is supplied to corresponding differential inputs of a pair of duty cycle error converter circuits 271a and 271b, each of which outputs a respective digital duty cycle measurement value ("dcm") correlated to the relative durations of the high and low phases of the clock signal. In one embodiment, for example, the greater the duration of the high phase of the clock signal, the higher the duty cycle measurement value, and, conversely, the greater the duration of the low phase of the clock signal, the lower the duty cycle measurement value. Accordingly, by twisting the differential clock inputs to one of the error converter circuits 271a, 271b relative to the other, counterpart true and complement duty cycle measurement values may be generated within error converter circuits 271a and 271b, respectively, with the true measurement being positively correlated to the high phase of the differential clock (i.e., growing in value as the high phase of Clk+ becomes longer relative to the high phase of Clk−) and the complement measurement positively correlated to the low phase of the differential clock. Because the true and complement measurements are correlated to the high and low phases of the clock, respectively, any inequality between the measurements, determined by difference circuit 273, indicates an inequality between the lengths of those clock phases and thus the direction of a clock duty cycle error.

While the directional duty cycle error alone may be used to perform incremental duty cycle correction (i.e., incremental correction to counter the direction of the error), the directional duty cycle error conveys no information regarding the error magnitude. In the embodiment of FIG. 4A, this shortcoming is rectified by generating a reference measurement that indicates the duty cycle error that would result if the duty cycle of the input clock signal was 100%. More specifically, an additional pair of "reference" duty cycle converter circuits 275a and 275b, implemented identically to those coupled to receive the input clock (271a and 271b), are provided to generate measures of a 100%-duty differential "reference" signal, as shown by the logic '1' and logic '0' inputs supplied to the converter inputs. As in the differential clock, the component legs of the differential reference input are twisted relative to one another at the inputs of duty cycle converter circuits 275a, 275b so that duty cycle converter 275a is tied high at its positive input, and duty cycle converter 275b is tied low at its positive input. By this arrangement, the two reference duty cycle converters 275a, 275b generate true and complement reference measurements ("rm") that represent the 100% on-time and 0% on-time of high phases of their respective inputs with the inequality between the true and complement reference measurements (generated by difference circuit 277) indicating the measurement difference that results from the maximum or full-scale duty cycle error (i.e., 100% duty cycle instead of 50% duty cycle). While conveying no absolute information, the full-scale duty cycle error provides a reference against which the clock duty cycle error may be compared within ratio logic 281 to normalize the clock duty cycle error and thereby yield a measure of the actual duty cycle error. That is, the ratio of the clock duty cycle error and the full scale duty cycle error indicates not only the direction of the clock duty cycle error, but also the magnitude of that error and thus the clock duty cycle error vector described above. By normalizing the clock duty cycle error through comparison with a full scale duty cycle error obtained concurrently with or near in time to determination of the clock duty cycle error (or through comparison with a full scale duty cycle error or other reference value that is otherwise correlated to the process, voltage and temperature bearing on the clock duty cycle error determination), the measurement is desensitized to variations in process, voltage, and temperature (PVT).

In one embodiment, the duty cycle converter generates pulses at one of two different rates, 'r' and 'n*r' (where '*' denotes multiplication), according to whether the signal applied to its differential input is low (i.e., signal at '+' input is low and signal at '−' input is high) or high (signal at '+' is high and signal at '−' is low). Designating the duration of the high phase of the input to be 'x' and the low phase of the input 'y', the number of pulses output by the true and complement clock duty cycle converters (271a and 271b) over a cycle time of the input clock may be expressed algebraically as:

$$\text{true pulse count: } x*n*r+y*r \tag{1}$$

$$\text{complement pulse count: } x*r+y*n*r \tag{2}$$

Accordingly, the clock duty cycle error that results from subtraction circuit 273 is:

$$\text{clock duty cycle error: } r(x*n+y)-r(x+y*n)=r(n-1)[x-y] \tag{3}$$

Because 'r' and 'n' are constants for given temperature, voltage and process, the duty cycle error is positive or negative according to whether 'x' or 'y' is greater, thus yielding the error directionality discussed above. Because 'r' and 'n' are unknown (and may vary with process, temperature and voltage), the magnitude of the duty cycle error is unknown. Now generating the same pulse counts and errors for the full-scale reference input ('1' and '0') over the input clock cycle time, 'C':

$$\text{true reference pulse count: } C*n*r \tag{4}$$

$$\text{complement pulse count: } C*r \tag{5}$$

$$\text{full-scale duty cycle error: } C*n*r-C*r=r(n-1)C \tag{6}$$

The ratio of the clock duty cycle error and the full-scale duty cycle error is then:

$$\text{duty cycle error vector: } r(n-1)[x-y]/r(n-1)C=[x-y]/C \tag{7}$$

Thus, the unknown pulse rates r and n*r fall out of the ratio of the two error measurements, yielding a net duty cycle error measurement that indicates both the direction of the duty cycle error (i.e., greater than or less than 50% duty according to whether 'x-y' is positive or negative) and the magnitude of the duty cycle error, the difference between the durations of the high and low clock phases in proportion to the total clock cycle time. To express the duty cycle error magnitude as a deviation relative to the 50% balance point, the error vector shown at equation (7) is divided by two, an operation that may be performed by ratio logic 281 if such an expression is desired or expected by downstream logic.

Still referring to FIG. 4A, control logic 279 responds to assertion of a service signal ("Service") by outputting control signals ("Cntrl") to the duty cycle error converters (271a/271b and 275a/275b) to enable their concurrent generation of respective duty cycle measurements. As discussed below, the timing and composition of the control signals may vary in different embodiments and/or configuration, for example, according to the accuracy required in the final duty cycle error vector and the implementation of the duty cycle converters. Also, ratio logic 281 is shown in dashed outline to emphasize that the ratio or division operation performed therein may instead be performed within other logic circuits on the same or different IC component. For example, in the exemplary memory subsystem of FIG. 3, the duty cycle error vector may be represented by component clock duty cycle error and full-scale duty cycle error values (i.e., the outputs of difference circuits 273 and 277, respectively), with those component values being returned to the memory controller and applied to enable magnitude-based adjustment of the duty cycle error. Similarly, the duty cycle measurements generated by duty cycle converters 271a/271b, 275a/275b may be output as component values that collectively represent (or enable determination or derivation of) the duty cycle error, thus obviating not only ratio logic 281, but also difference logic circuits 273 and 277 within vector measurement logic 270, leaving the difference and ratio operations to be performed elsewhere.

FIG. 4B illustrates an alternative embodiment of an error vector measurement logic circuit 300 that may be used to implement the error vector measurement logic of FIGS. 2 and 3. Vector measurement logic 300 operates similarly to the vector measurement logic of FIG. 4A, except that a single duty cycle converter 301 is applied in time multiplexed fashion to generate the component duty cycle measurements that are subtracted from one another to produce the clock duty cycle error measurement and the full-scale (reference) duty cycle error measurement. In the embodiment shown, control logic 311 responds to assertion of a service signal by setting a source select signal (SrcSel) to select the differential clock input at port '0' of multiplexer 303 to drive the differential input of duty cycle converter 301 and simultaneously asserting a count-up enable signal (EnCntUp), maintaining assertion of the multiplexer control signal and count-up enable signal over a predetermined measurement interval.

In one embodiment, control logic 311 is clocked by the input clock (or a timing signal derived therefrom) and sets the measurement interval to an integer number (one or more) of input clock cycles. However long the measurement interval, the assertion of the count-up enable signal enables duty cycle error converter 301 to count up measurement clock pulses generated at different rates during the high and low phases of the input clock, thus generating a positive count as a measure of the clock duty cycle. During a subsequent measurement interval, control logic 311 switches the source-select signal to select multiplexer input port '1', passing an inverted instance of the input clock to the differential input of duty cycle error converter 301 (e.g., effected by twisting the Clk+ and Clk− at the input of the duty cycle error converter) and simultaneously asserts a count-down enable signal ("EnCntDn") to enable the duty cycle converter to count down in response to the measurement clock pulses generated during the high and low phases of the inverted input clock. By this operation, the measure of the inverted clock duty cycle is effectively subtracted from the measure of the non-inverted clock duty cycle, thus yielding a clock duty cycle error corresponding to the output of difference circuit 273 of FIG. 4B. At the conclusion of the second measurement interval, control logic 311 asserts a clock-measurement load signal ("c-Ld") to enable the clock duty cycle error measurement to be stored within register 305 (or latch), thus capturing that measurement value while duty cycle error converter 301 is reapplied in a subsequent pair of measurement intervals to count-up the 100% duty input (multiplexer port '3') and count down the 0% duty input (multiplexer port '4'), asserting reference-measurement load signal ("r-Ld") to latch the reference result in full-scale duty cycle error register 307. Note that control logic 311 may also output a reset signal to duty cycle error converter 301 to clear the measurement value therein (i.e., the differential pulse count) concurrently with or after latching a given error measurement within registers 305 and 307. As in the embodiment of FIG. 4A, ratio logic 309 may be provided to generate a ratio of the clock duty cycle error and full-scale duty cycle error measurements, thus outputting a duty cycle error vector (i.e., indicating the direction and magnitude of the duty cycle error). Alternatively, ratio logic 309 may be omitted and the component clock and full-scale duty cycle measurements output from vector measurement logic 300 as a representation of the duty cycle error vector.

Figure 5A:
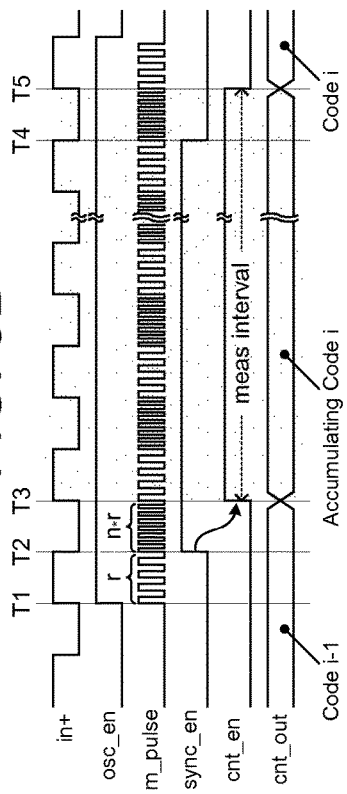
FIG. 5A illustrates an embodiment of a duty cycle error converter that may be used to implement any or all of the duty cycle error converters within vector measurement logic circuits.

FIG. 5A illustrates an embodiment of a duty cycle error converter 330 that may be used to implement any or all of the duty cycle error converters (271a, 271b, 275a, 275b) within the vector measurement logic circuits described above. As shown, duty cycle error converter 330 includes a ring oscillator 331 to generate a stream of measurement pulses ("m_pulse") at one of two different pulse rates according to the state of differential input signal in+/in−. More specifically, when the differential input is low (i.e., in+ is low and in− is high) and an oscillator-enable signal ("osc_en") is asserted, bias current transistors 335a, 335b, 337a and 337b are switched on to establish a maximum bias current ($I_s$) through the constituent inverter stages of ring oscillator 311 (e.g., as shown for example at 341) and thus a maximum (upper) measurement pulse rate at the oscillator output. By contrast, when the differential input goes high (in+ high and in− low), bias transistors 335a and 337a are switched off, thus reducing the bias current through the inverter stages of ring oscillator 331 and effecting a reduced (lower) measurement pulse rate at the oscillator output. The lower and upper measurement pulse rates may be expressed as r and n*r as shown in the measurement analysis above.

Still referring to FIG. 5A, a sync-enable signal ("sync_en") is raised and then lowered (e.g., by the control logic circuit of FIG. 4A) to enable a duty cycle measurement. In the embodiment shown, the sync-enable signal is latched within a register 339 (e.g., a flip-flop) in response to the rising edge of an input clock signal (i.e., Clk+ going from low to high and Clk− from high to low), thus yielding a count-enable signal ("cnt_en") that is synchronized to the input clock signal and tracks the state of the sync-enable signal. Accordingly, by asserting the sync-enable signal shortly before a given rising edge of the input clock signal and then lowering the sync-enable signal shortly before a later rising edge of the input clock signal, the count-enable signal is raised and lowered in synchronism with the rising edges of the input clock, thereby enabling measurement pulses to be counted within a pulse counter 333 over an integer number of input clock cycles. After completing a measurement or sequence of measurements, the oscillator-enable signal may be deasserted to switch off transistors 335b and 337b (the former being switched off via the high-going output of inverter 338) and otherwise disable oscillator 331, thus limiting static power consumption.

Figure 5B:
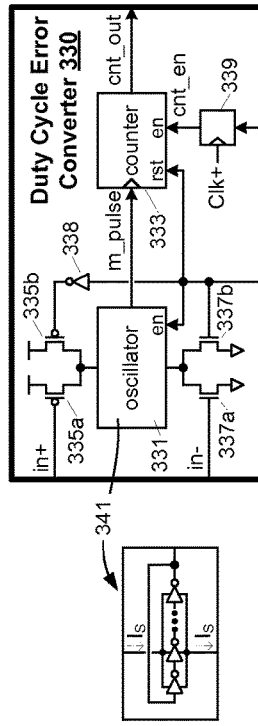
FIG. 5B is a timing diagram illustrating an exemplary operation of the duty cycle error converter of FIG. 5A.

FIG. 5B is a timing diagram illustrating an exemplary operation of the duty cycle error converter of FIG. 5A. Starting at time T1, the oscillator-enable signal is asserted to enable measurement pulse generation within ring oscillator 331 and reset the count value within counter 333. As explained, the measurement pulse frequency alternates between rates r and n*r during the high and low phases of the clock signal, respectively. In the embodiment shown, the sync-enable signal is asserted at time T2, a brief time after assertion of the oscillator-enable signal (e.g., to provide time for the oscillator to escape any metastable condition and begin oscillating), and yields a corresponding assertion of the count-enable signal at the ensuing rising edge of the input clock signal (T3) which is assumed to be the input signal, in+/in−, in this example. The sync-enable signal remains asserted for a predetermined number of input clock cycles (which may alternatively be a single clock cycle) and is then deasserted at time T4, producing a corresponding deassertion of the count-enable signal at time T5 (i.e., in response to the ensuing rising edge of the input clock signal). By this operation, measurement pulses corresponding to duty cycle measurement 'i' or "code i" are counted within counter 333 over the measurement interval shown (from T3 to T5), with the duty cycle code being effectively latched within the counter when the count-enable signal is deasserted. Because the total number of pulses counted (accumulated) during the measurement interval is determined by the relative durations of the high and low phases of the input clock signal, the pulse accumulation is correlated to the input clock duty cycle as explained above.

Figure 6A:
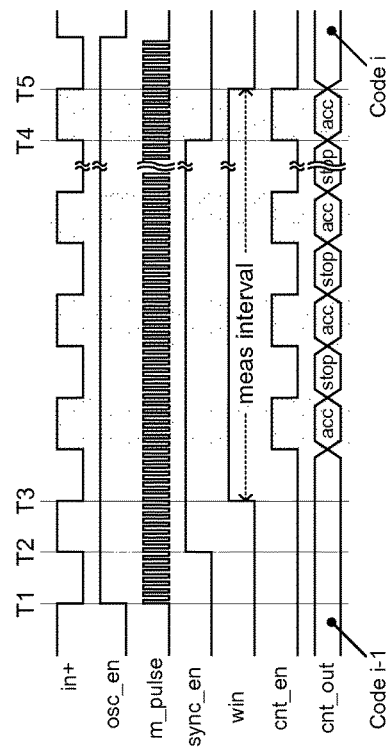
FIG. 6A illustrates an alternative embodiment of a duty cycle converter that may be used to implement duty cycle converters within vector measurement logic circuits.

FIG. 6A illustrates an alternative embodiment of a duty cycle converter 360 that may be used to implement duty cycle converters within the vector measurement logic circuits described above. As in the embodiment of FIG. 5A, duty cycle converter 360 includes an oscillator 361 to generate a measurement pulse stream when enabled by an oscillator-enable signal ("osc_en"), and a pulse counter 363 to count measurement pulses when enabled by a count-enable signal ("cnt_en"). Instead of varying the oscillator supply current to effect different measurement pulse rates during high and low phases of the input clock, however, a steady-state supply current is delivered to oscillator 361 (thus yielding a steady measurement pulse rate) while the count-enable signal is switched on and off in response to high and low states of the input signal, respectively, thereby accumulating a measurement pulse count only during the high phase of an input clock signal. In the particular embodiment shown, the oscillator-enable signal is asserted to switch on oscillator-power transistors 367 and 365 (with inverter 368 supplied to provide an active-low enable signal to transistor 365) and also to reset pulse counter 363. As in the embodiment of FIG. 5A, a separate reset signal may be supplied to the pulse counter if different signal measurements are to be captured within the duty cycle converter in back-to-back intervals without disabling oscillator 331.

Still referring to FIG. 6A, a sync-enable signal ("sync_en") is raised and then lowered (e.g., by the control logic circuit of FIG. 4A) to enable a duty cycle measurement. The sync-enable signal is latched within a register 369 (e.g., a flip-flop) in response to the rising edge of an input clock signal (i.e., Clk+ going from low to high and Clk− from high to low) to produce a window signal ("win") that tracks the state of the sync-enable signal in synchrony with the input clock signal. Accordingly, by asserting the sync-enable signal shortly before a given rising edge of the input clock signal and then lowering the sync-enable signal shortly before a later rising edge of the input clock signal, the window signal is raised and lowered in synchronism with respective rising edges of the input clock, thereby enabling measurement pulses to be counted within counter 363 over a measurement interval corresponding to an integer number of input clock cycles. In the embodiment shown, the window signal is gated by the input signal (which may be a clock signal or a steady state signal as discussed above) in AND gate 371 to yield a count-enable signal (cnt_en) that alternates between high and low states during the measurement interval according to the state of the input signal, thus enabling the counter to count pulses during the measurement interval (i.e., while the window signal is high) only during the high phase(s) of the input signal.

Figure 6B:
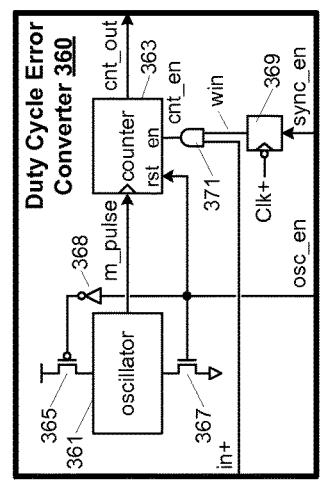
FIG. 6B is a timing diagram illustrating an exemplary operation of the duty cycle error converter of FIG. 6A.

FIG. 6B is a timing diagram illustrating an exemplary operation of the duty cycle error converter of FIG. 6A. Starting at time T1, oscillator-enable signal is asserted to enable constant-rate measurement pulse generation within oscillator 361 and reset the count value within counter 363. In the embodiment shown, the sync-enable signal is asserted at time T2 (i.e., shortly after assertion of the oscillator-enable signal to provide time for the oscillator to escape any metastable condition) and yields a corresponding assertion of the window signal at the ensuing rising edge of the input clock signal (T3) which, in this case is assumed to be the input signal, in+/in−. The sync-enable signal remains asserted for a predetermined number of input clock cycles and is then deasserted at time T4, producing a corresponding deassertion of the window signal at time T5 (i.e., in response to the ensuing rising edge of the input clock signal). The logical ANDing of the window signal and input signal yields the shaded sequence of count-enable pulses shown (i.e., when the input signal is a clock signal), thus alternately enabling and disabling measurement pulse counting in accordance with the state of the input signal over the measurement window. By this operation, the count output ("cnt_out") accumulates ("acc") during high phases of the input signal and remains steady ("stop") during low phases of the input signal, yielding a finalized duty cycle measurement ("Code i") within the counter at the conclusion of the measurement window.

The constant-rate, input-gated counting operation within the duty cycle converter of FIG. 6A yields a somewhat different result than the dual pulse-rate counting operation within the duty cycle converter of FIG. 5A. More specifically, designating the duration of the high phase of the input to be 'x' and the low phase of the input 'y', the number of pulses output by true and complement clock duty cycle converters (e.g., 271a and 271b in FIG. 4A) over a cycle time of the input clock may be expressed algebraically as "x*r" and "y*r," respectively. Accordingly, the clock duty cycle error that results from the difference between the two measurements is:

$$\text{clock duty cycle error: } r(x*n+y)-r(x+y*n)=r[x-y] \quad (8)$$

Again, because 'r' is constant for a given temperature, voltage and process, the duty cycle error is positive or negative according to whether x or y is greater, thus yielding the error directionality discussed above. Because 'r' is unknown, the magnitude of the duty cycle error is unknown. Noting that sum of the true and complement pulse counts constitutes a full-scale pulse count (i.e., $C*r=x*r+y*r=r[x+y]$) and thus a full-scale duty cycle error, it follows that the difference between the true and complement duty cycle measures may be divided by the sum of the true and complement duty cycle measures to obtain a duty cycle error vector:

$$\text{duty cycle error vector: } r[x-y]/r[x+y]=x-y/C \quad (9)$$

Thus, the unknown pulse rate 'r' falls out of the ratio of the difference and sum of the two duty cycle measures, yielding a net duty cycle error measurement that indicates both the direction of the duty cycle error (i.e., greater than or less than 50% duty according to whether 'x−y' is positive or negative) and the magnitude of the duty cycle error, the difference between the durations of the high and low clock phases in proportion to the total clock cycle time. As before, to express the duty cycle error magnitude as a deviation relative to the 50% balance point, the error vector shown at equation (9) may be divided by two, an operation that may be performed within the vector measurement logic described above or elsewhere within a duty cycle controller if such an expression is desired or expected by downstream logic.

Reflecting on the analysis above, it can be seen that the input-gated pulse counting embodiment permits a vector measurement logic implementation with fewer duty cycle measurement operations, for example, allowing the '1' and '0' duty cycle measurement circuits to be omitted from the embodiment of FIG. 4A and the third and fourth duty cycle measurement sequences (and the port 3 and port 4 multiplexer selections) to be omitted in the embodiment of FIG. 4B. Noting that a measure of either the low input phase or high input phase may be determined from a measurement of the other phase and a measurement of the pulse accumulation over a full measurement interval (i.e., y=C−x and x=C−y) it follows that if one of the input phases is measured and a logic '1' is measured, the other input phase may be determined from the input-phase measurement and full-scale measurement just as the full-scale measurement of 'C' is determined from the measurements of the two input phases, 'x' and 'y'. More generally, it should be noted that various changes may be made from the duty cycle converters and their implementation within a vector measurement logic circuit in alternative embodiments. For example, counters 333 and 363 may be implemented by up/down counters that receive separate enable-up and enable-down signals to permit differential pulse counting within the vector measurement logic of FIG. 4B. Also, measurement pulse sources other than the ring oscillator shown in FIG. 5A may be used (e.g., any number of oscillator implementations having a frequency-versus-voltage dependence, and which may serve additional purposes within the larger clocked system or host system). Alternative synchronization logic circuits, counter reset arrangements and corresponding control signals may be used and more generally, non-digital implementations of a duty cycle converter may be used. For example, an analog measurement voltage may be integrated during the shaded intervals shown in FIGS. 6A and 6B and then converted to a digital value for post-processing or applied in analog difference and/or ratio operations to yield a proportional voltage error. Additionally, different types of reference measurements may be used (e.g., measuring the input clock signal at a source point that exhibits 50% or near 50% duty, if available. Further, while generating reference (e.g., full-scale) measurements concurrently with or otherwise near in time to clock duty cycle measurements serves to track out temperature- and voltage-dependent variations in measurement results (e.g., changes in the pulse rate cancel), such measurements may alternatively be performed in advance, with the reference measurements being either hardwired within the vector measurement logic or stored in a lookup table. In one embodiment, for example, full-scale measurements are generated across a range of processes, voltages and/or temperatures (extending between corners) and stored within a lookup table or other programmable reference source. Corresponding measures of the process, voltage and temperature point (or any one or pair of those points) may then be used to index a reference measurement (full-scale or otherwise) within the lookup table and thus enable error vector generation with fewer run-time measurements.

Figure 7:
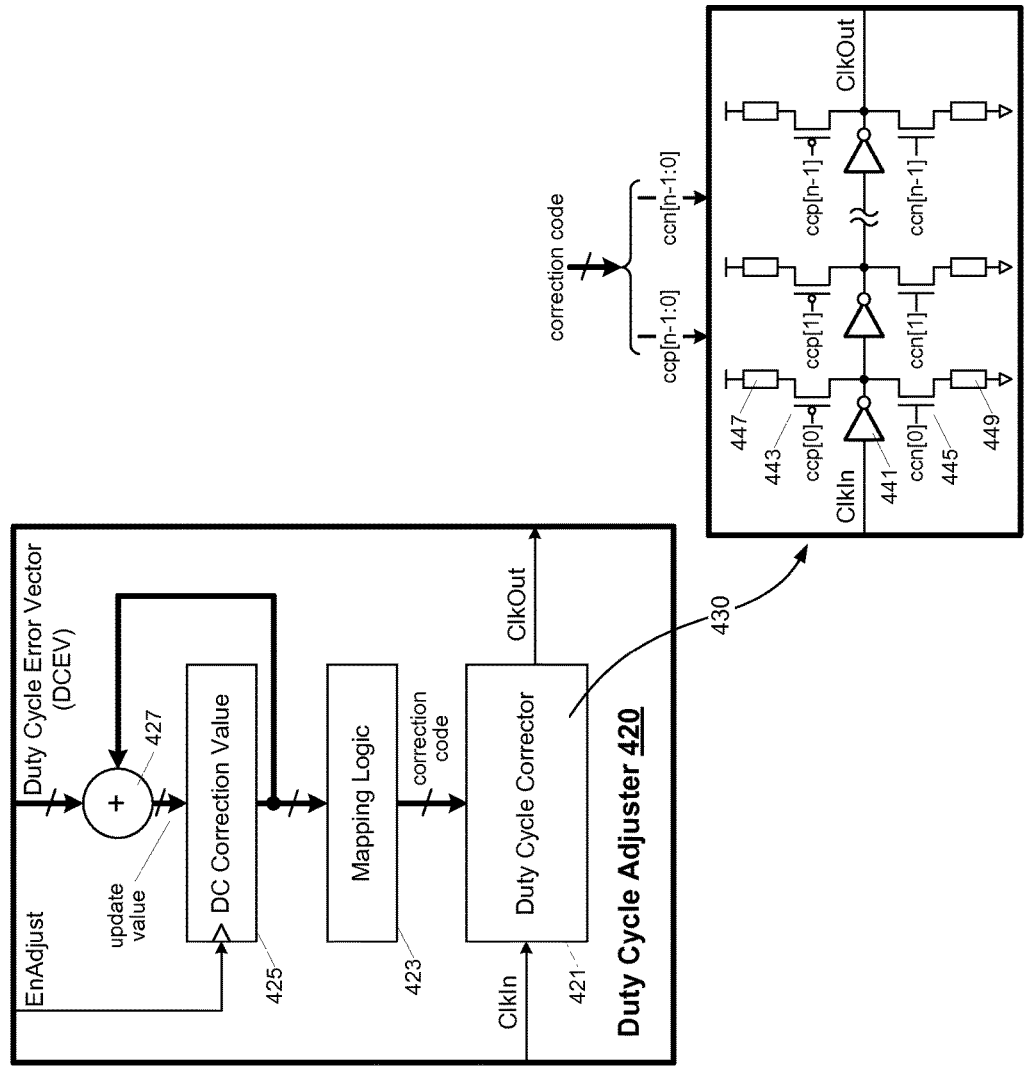
FIG. 7 illustrates an embodiment of a duty cycle adjuster 420 that performs conditional, magnitude-based error correction.

FIG. 7 illustrates an embodiment of a duty cycle adjuster 420 that performs conditional, magnitude-based error correction. As shown, the duty cycle adjuster includes a duty cycle corrector circuit, mapping logic 423, correction register 425 and summing circuit 427. Correction register 425 is provided to store a duty cycle correction value which is output to mapping logic 423 and applied therein to select or look-up a corresponding multi-bit correction code. The correction code is output from mapping logic 423 to duty cycle corrector 421 which, in response adjusts (or corrects) the duty cycle of an incoming clock signal, ClkIn, to generate a duty-cycle-corrected output clock, ClkOut. The mapping of correction codes to duty cycle correction values may be established during run-time calibration operations, by hardwiring (or hard-coding), or by any combination of calibration and pre-determined mapping that yields monotonic, stepwise changes in clock duty cycle as the duty cycle correction value is incremented through a given range.

Summing circuit 427 receives the multi-bit duty cycle correction value from correction register 425 and an incoming duty cycle error vector, DCEV (e.g., generated by vector measurement logic as described above) and, in response, outputs a signed arithmetic sum of the two values to a parallel load input of correction register 425. Thus, if the duty cycle error vector is a positive value, the magnitude of the duty cycle error is added to the existing duty cycle correction value to yield an updated duty cycle correction value, and if the duty cycle error vector is negative, the magnitude of the duty cycle error is subtracted from the existing duty cycle correction value to produce the updated correction value. In either case, when an enable-adjust signal (EnAdjust) is asserted, the updated duty cycle correction value is loaded into correction register 425 and applied, via mapping logic 423, to duty cycle corrector 421 to effect a duty cycle adjustment.

In an exemplary implementation of a duty cycle corrector, illustrated in detail view 430, the input clock propagates through a sequence of series-coupled inverters 441, the outputs of which are variably loaded according to the incoming correction code. In the embodiment shown, for example, the output node of each inverter 441 is switchably coupled to a pull-up load 447 via switching element 443 and to a pull-down load 449 via switching element 445. The pull-up and pull-down switching elements are closed or open according to the state of respective bits of the correction code (split into pull-up and pull-down bit fields, ccp[n−1:0] and ccn[n−1:0], in the example shown), thereby enabling the output slew rate of each inverter 441 to be selectively adjusted in either the rising or falling direction. Thus, the effective propagation time through each of inverter stage 441 may be adjusted in a directionally-dependent way to increase or decrease the clock duty cycle, with the set of adjustable-slew-rate inverter stages enabling duty cycle adjustment over a desired range. Note that duty cycle corrector 421 may be implemented by a differentially clocked circuit instead of the single-ended circuit shown. More generally, numerous other duty cycle corrector implementations and duty cycle adjuster implementations may be applied in alternative embodiments.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be single-ended or differential. A signal driving circuit is said to "output" a signal to a signal receiving circuit when the signal driving circuit asserts (or deasserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" may include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement.

While the invention has been described with reference to specific embodiments thereof, it will be evident that various modifications and changes may be made thereto without departing from the broader spirit and scope. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A method of controlling duty cycle of a clock signal, the method comprising:
   measuring a difference between durations of high and low phases of the clock signal;
   generating a time-varying reference value representative of a period of the clock signal;
   generating, as an error value, a ratio of the difference and the time-varying reference value such that the error value indicates a magnitude of the difference in relation to the period of the clock signal; and
   adjusting the duty cycle of the clock signal if the magnitude exceeds an error threshold.

2. The method of claim 1 wherein generating the time-varying reference value representative of the period of the clock signal comprises measuring a difference between high and low phases of a reference signal over a measurement interval defined by a pair of rising edges of the clock signal or a pair of falling edges of the clock signal.

3. The method of claim 2 wherein the reference signal is a steady-state signal in which only one of the high and low phases of the reference signal has a nonzero duration such that the difference between the high and low phases of the reference signal corresponds to a maximum measurable difference over the measurement interval.

4. The method of claim 1 wherein generating the time-varying reference value representative of the period of the clock signal comprises looking up the reference value in a look-up table, including indexing the lookup table based, at least in part, on at least one of a temperature indication or a voltage indication.

5. The method of claim 1 further comprising storing a first threshold value within a programmable storage register to establish the error threshold.

6. The method of claim 1 wherein adjusting the duty cycle of the clock signal if the magnitude exceeds an error threshold comprises adjusting the duty cycle of the clock signal in proportion to the magnitude in response to determining that the magnitude exceeds the error threshold.

7. The method of claim 1 wherein measuring the difference between durations of high and low phases of the clock signal comprises:
generating a first pulse stream that pulses at a first rate when the clock signal is in a first logic state and at a second rate when the clock signal is in a second logic state;
counting the pulses in the first pulse stream over a first measurement interval to produce a first count value.

8. The method of claim 7 wherein measuring the difference between durations of high and low phases of the clock signal further comprises:
generating a second pulse stream that pulses at the second rate when the clock signal is in the first logic state and at the first rate when the clock signal is in the second logic state;
counting the pulses in the second pulse stream over a first time interval equal in duration to the first measurement interval to produce a second count value; and
subtracting the second count value from the first count value to produce a value corresponding to the difference between the durations of the high and low phases of the clock signal.

9. The method of claim 8 wherein generating the time-varying reference value representative of the period of the clock signal comprises:
generating a third pulse stream that pulses at the first rate;
counting pulses in the third pulse stream over a second time interval equal in duration to the first measurement interval to produce a third count value;
generating a fourth pulse stream that pulses at the second rate; and
counting pulses in the fourth pulse stream over a third time interval equal in duration to the first measurement interval to produce a fourth count value, subtracting the fourth count value from the third count value to produce the reference value.

10. The method of claim 1 wherein measuring the difference between durations of high and low phases of the clock signal comprises:

generating a first pulse stream;
during a first measurement interval, counting pulses in the first pulse stream when the clock signal is in a first logic state to produce a first count value;
generating a second pulse stream;
over a time interval equal in duration to the first measurement interval, counting pulses in the second pulse stream when the clock signal is in a second logic state to produce a second count; and
subtracting the second count value from the first count value to produce a value corresponding to the difference between the durations of the high and low phases of the clock signal.

11. An integrated circuit device comprising:
duty cycle measurement logic to measure a difference between durations of high and low phases of the clock signal;
reference value logic to generate a time-varying reference value representative of a period of the clock signal;
ratio logic to generate, as an error value, a ratio of the difference and the time-varying reference value such that the error value indicates a magnitude of the difference in relation to the period of the clock signal; and
duty cycle adjustment circuitry to adjust the duty cycle of the clock signal if the magnitude exceeds an error threshold.

12. The integrated circuit device of claim 11 wherein the reference value logic comprises circuitry to measure a difference between high and low phases of a reference signal over a measurement interval defined by a pair of rising edges of the clock signal or a pair of falling edges of the clock signal.

13. The integrated circuit device of claim 11 reference value logic comprises a lookup table and logic to retrieve the reference value from the lookup table based, at least in part, on at least one of a temperature indication or a voltage indication.

14. The integrated circuit device of claim 11 further comprising a programmable storage register to store a control value that establishes the error threshold.

15. The integrated circuit device of claim 11 wherein the duty cycle adjustment circuitry to adjust the duty cycle of the clock signal comprises circuitry to adjust the duty cycle of the clock signal in proportion to the magnitude in response to determining that the magnitude exceeds the error threshold.

16. The integrated circuit device of claim 11 wherein the duty cycle measurement logic to measure a difference between durations of high and low phases of the clock signal comprises circuitry to generate a first pulse stream that pulses at a first rate when the clock signal is in a first logic state and at a second rate when the clock signal is in a second logic state, and to count the pulses in the first pulse stream over a first measurement interval to produce a first count value.

17. The integrated circuit device of claim 16 wherein the duty cycle measurement logic further comprises circuitry to (i) generate a second pulse stream that pulses at the second rate when the clock signal is in the first logic state and at the first rate when the clock signal is in the second logic state, (ii) count the pulses in the second pulse stream over a first time interval equal in duration to the first measurement interval to produce a second count value, and (iii) subtract the second count value from the first count value to produce a value corresponding to the difference between the durations of the high and low phases of the clock signal.

18. The integrated circuit device of claim 17 wherein the reference value logic comprises circuitry to (i) generate a third pulse stream that pulses at the first rate, and count the pulses in the third pulse stream over a second time interval equal in duration to the first measurement interval to produce a third count value, (ii) generate a fourth pulse stream that pulses at the second rate, and count the pulses in the fourth pulse stream over a third time interval equal in duration to the first measurement interval to produce a fourth count value, and (iii) subtract the fourth count value from the third count value to produce the reference value.

19. The integrated circuit device of claim 11 wherein the duty cycle measurement logic to measure the difference between durations of high and low phases of the clock signal comprises circuitry to (i) generate a first pulse stream, and count pulses in the first pulse stream when the clock signal is in a first logic state to produce a first count value, (ii) generate a second pulse stream, and count pulses in the second pulse stream when the clock signal is in a second logic state to produce a second count value, and (iii) subtract the second count value from the first count value.

20. An integrated circuit device comprising:
   means for measuring a difference between durations of high and low phases of the clock signal;
   means for generating a time-varying reference value representative of a period of the clock signal;
   means for generating, as an error value, a ratio of the difference and the time-varying reference value such that the error value indicates a magnitude of the difference in relation to the period of the clock signal; and
   means for adjusting the duty cycle of the clock signal if the magnitude exceeds an error threshold.

* * * * *